INVENTOR
JACK GILBERT
BY Henry L. Shenier
ATTORNEY

INVENTOR
JACK GILBERT
BY [signature]
ATTORNEY

United States Patent Office 3,019,426

Patented Jan. 30, 1962

3,019,426

DIGITAL-TO-ANALOGUE CONVERTER

Jack Gilbert, White Plains, N.Y., assignor, by mesne assignments, to United Aircraft Corporation, East Hartford, Conn., a corporation of Delaware Filed Nov. 29, 1957, Ser. No. 699,597
7 Claims. (Cl. 340—347)

My invention relates to a digital-to-analogue converter and more particularly to an improved digital-to-analogue converter for producing an output voltage having an amplitude proportional to the magnitude of a binary coded decimal number.

A present need exists for a digital-to-analogue converter and for an analogue-to-digital converter which is capable of operating at electronic speeds. These converters can be used as links to couple all-analogue to all-digital systems. They may be used to convert rapidly varying numerical inputs for automatic positioning systems and may be used to afford high speed read-out for digital and analogue signals. Converters of this type have also been employed to provide digital read-out of analogue quantities such as temperature, pressure and voltage in telemetering and industrial control devices.

In converters of the type discussed hereinabove electromechanical switching devices are not practical as circuit elements owing to their relatively short life in a high speed system. Most converters of the prior art are not capable of operating at electronic speeds. The few converters of the prior art which are capable of operating at high conversion rates are too heavy and too large for many uses. Also, these converters of the prior art are too expensive to warrant their use in many cases. It is desirable that a converter be provided for producing an alternating current output analogue of a digital input signal. The converters of the prior art all employ direct current voltage inputs and outputs.

It has been proposed that a system be provided in which resistors having values inversely proportional to the significance of the binary bits of a digital representation be connected in a circuit to produce a current or voltage having a magnitude proportional to the number represented by a digital input. Such a system has the basic disadvantage of requiring a wide range of values of the summing resistors. In this system it is extremely difficult to choose resistor values for the most significant digits. For example, if a number requires eleven bits for its representation a dynamic range of resistance values of 1024 to 1 is required.

I have invented a digital-to-analogue converter which is capable of producing an output signal such as a direct or alternating voltage having an amplitude proportional to the value of a binary coded decimal number. My system does not require a wide dynamic range of impedance values. My system is less expensive to manufacture than systems of the prior art. My system is less bulky and is lighter than are converters of the prior art. It is capable of performing at electronic speeds and it may be used in a system to provide analogue-to-digital conversion.

One object of my invention is to provide a digital-to-analogue converter for producing an output voltage having an amplitude proportional to the value of a binary coded decimal number.

Another object of my invention is to provide a digital-to-analogue converter which is less expensive to manufacture than converters of the prior art.

A further object of my invention is to provide a digital-to-analogue converter which is less bulky and which is lighter than converters of the prior art.

A still further object of my invention is to provide a digital-to-analogue converter which is capable of performing at electronic speeds.

Still another object of my invention is to provide a digital-to-analogue converter which may be used in a system to provide analogue-to-digital conversion.

Other and further objects of my invention will appear from the following description.

In general my invention contemplates the provision of a digital-to-analogue converter for producing an output voltage having an amplitude proportional to a binary coded decimal number represented by binary bit groups corresponding to the respective digits of the number. My converter has a number of groups of parallel connected circuits corresponding to the groups of the binary bits representing the number. Each parallel circuit includes a normally nonconducting element and an impedance connected in series. The impedances of the respective circuits of each group have values which are inversely proportional to the significances of the respective bits of the group. I provide my converter with means for applying respective input potentials to the groups of circuits. The magnitudes of the respective potentials applied to the groups of circuits are inversely proportional to the significance of the decimal digits represented by the respective groups. My converter has means for applying the binary bits of the groups representing the decimal number to the respective normally nonconducting elements of the parallel connected circuits. The arrangement is such that if any bit has a value representing a "1," the element to which it is applied is rendered conductive to connect its associated resistor in the circuit of the potential source. In this manner resistances are connected in the circuits of the potential sources to produce respective alternating current signals having amplitudes proportional to the values of the decimal digits represented by the groups of binary bits. I provide my system with means for summing these alternating current signals to produce an output signal having an amplitude which is proportional to the decimal number being represented. By connecting my digital-to-analogue converter in a comparator circuit and providing the system with a feedback from the comparator I may make my converter function to provide an analogue-to-digital conversion.

In the accompanying drawings which form part of the instant specification and which are to be read in conjunction therewith and in which like reference numerals are used to indicate like parts in the various views.

Figure 1:
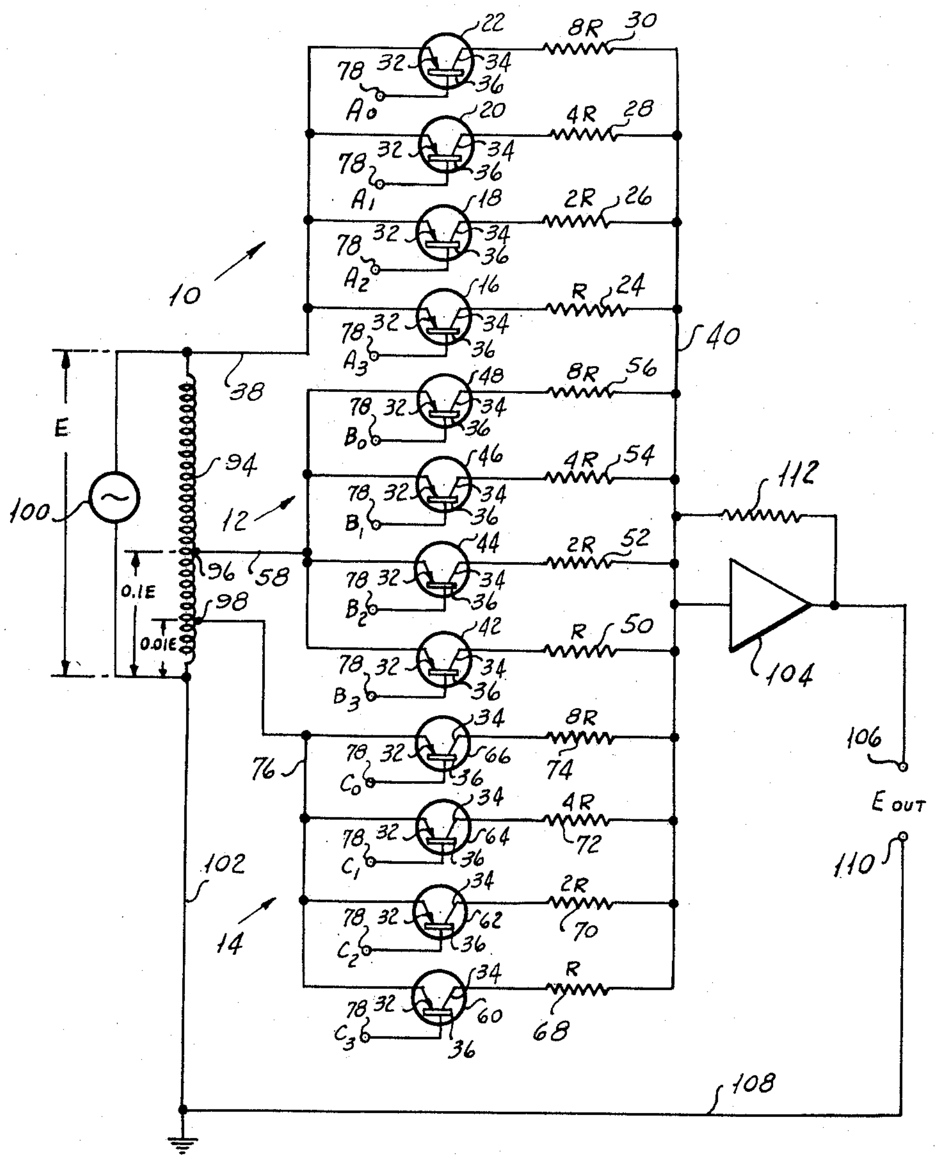
FIGURE 1 is a schematic view of one form of my digital-to-analogue converter.

More particularly referring now to the drawings, the form of my digital-to-analogue converter shown is adapted to convert the digital representation of a three-digit binary coded decimal number into an alternating current signal having an amplitude proportional to the number represented. The digital representation of the three-digit decimal number may be represented by three respective groups of binary bits: group $A_3$, $A_2$, $A_1$ and $A_0$; group $B_3$, $B_2$, $B_1$ and $B_0$; and group $C_3$, $C_2$, $C_1$ and $C_0$.

Referring now more particularly to FIGURE 1, my converter includes three groups of parallel-connected circuits which groups are indicated generally respectively by the reference characters 10, 12 and 14. The respective parallel circuits of group 10 are made up of respective transistors 16, 18, 20 and 22 and resistors 24, 26, 28 and 30. Each transistor has an emitter 32, a collector 34 and a base 36. I connect the transistor and resistor of each parallel circuit of the group 10 of circuits in series between an input conductor 38 and a conductor 40. For example, I connect the emitter 32 of transistor 16 to conductor 38 and connect the resistor 24 between collector 34 of transistor 16 and conductor 40.

I connect the transistors 42, 44, 46 and 48 of the parallel-connected circuits of the group 12 in series with respective resistors 50, 52, 54 and 56 between an input conductor 58 and the conductor 40. The transistors 42, 44, 46 and 48 have emitters 32, collectors 34 and bases 36.

I connect the transistors 60, 62, 64 and 66 of the group 14 in series with respective resistors 68, 70, 72 and 74 between an input conductor 76 and conductor 40. These connections are made in the same manner as are the connections of the group 10 of parallel-connected circuits. Each transistor 60, 62, 64 and 66 has an emitter 32, a collector 34 and a base 36. Each of the transistors of my converter includes a base input terminal 78 to which I apply one of the binary bits of the digital representation of the decimal number. In one form of my converter the transistors may, for example, be p-n-p transistors, which conduct in a forward direction when the emitter is positive with respect to the base. In my system a negative-going pulse represents a "1" in the binary system while ground potential represents a "0." It will be seen that if a negative-going pulse is applied to the base terminal 78 of any transistor, this transistor conducts in a forward direction.

Figure 2:
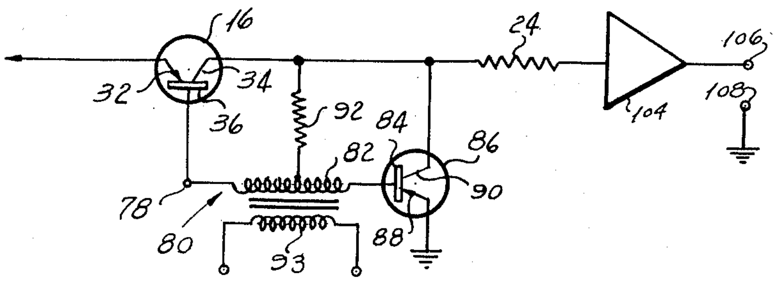
FIGURE 2 is a schematic view of one form of switch arrangement which may be used with my digital-to-analogue converter.

Referring now to FIGURE 2, one form of switching device which may be used to render a transistor such as the transistor 16 conductive in response to a negative-going pulse includes a transformer, indicated generally by the reference character 80, having a secondary winding 82 connected between the base input terminal 78 of transistor 16 and the base 84 of a transistor 86. I connect the emitter 88 of transistor 86 to ground and connect the collector 90 of transistor 86 to the common terminal of collector 34 and resistor 24. I connect a resistor 92 between a center tap on winding 82 and collector 34 of transistor 16. In order to switch transistor 16 to a conducting condition in the forward direction I apply the pulse representing a binary bit to the primary winding 93 of transformer 80. It will be seen that if the pulse applied to primary winding 93 induces a voltage in secondary winding 82 of a polarity to drive base 36 negative with respect to emitter 32 transistor 16 conducts in a forward direction. At the same time, the potential of base 84 is raised above ground with the result that transistor 86 will not conduct. In this switching arrangement the shunt transistor 86 is shorted when the series transistor 16 is open or nonconductive and transistor 16 conducts when transistor 86 is open. This arrangement protects against finite currents and pickup voltages in the reverse direction. At the same time, the impedance from the input circuit to emitter 32 to resistor 24 and to ground is reduced to a very low value reducing any tendency to pick up noise or unwanted signals.

As has been explained hereinabove, a system could be provided in which the values of all resistances switched into the circuit by the binary representation have values which are inversely proportional to the significances of the binary bits. As has also been explained hereinabove, such a system embodies the basic defect that it requires a very wide range of dynamic resistance values. In my arrangement the resistors of each group have values which are inversely proportional to the significance of the bits of the group. For purposes of clarity in the drawing I have indicated the bits fed to the respective base input terminals of the transistors adjacent these terminals. For example, the bits $A_3$ to $A_0$ from most significant to least significant digit of the decimal number are fed to the respective input terminals 78 of transistors 16, 18, 20 and 22. The resistors 24, 26, 28 and 30 connected in series with the respective transistors 16, 18, 20 and 22 have relative values of R, 2R, 4R and 8R. It will be seen that the resistance value in any of the parallel-connected circuits of the group 10 is inversely proportional to the significance of the bit fed to the associated transistor.

The resistors 50, 52, 54 and 56 of the group 12 of circuits and the resistors 68, 70, 72 and 74 of the group 14 of circuits have resistance values which are inversely proportional to the significance of the bits applied to the associated transistors. As has been explained hereinabove, in one proposed system if the resistor 24 corresponding to the most significant bit $A_3$ of the group of bits representing the most significant digit of the decimal number had a value of R, then the resistor 74 corresponding to the least significant bit $C_0$ of the group of bits representing the least significant digit of the decimal number would be required to have a value of 800R. In my converter I avoid the necessity of employing such a wide dynamic range of resistance values. The respective groups of resistors of each group of parallel-connected circuits 10, 12 and 14 have the same respective resistance values. These resistors 24, 50 and 68 have a resistance value R while the resistors 30, 56 and 74 all have a resistance value of 8R.

I connect an autotransformer winding 94 having respective taps 96 and 98 across a source 100 of alternating current voltage which may, for example, be a 400 c.p.s. source having a magnitude E. I connect the winding 94 between the conductor 38 and a conductor 102 connected to ground. As a result, the entire voltage E is applied to the group 10 of circuits corresponding to the most significant digit of the decimal number. The location of tap 96 is such that a voltage value of 0.1E is provided at this tap. I connect conductor 58 to tap 96 to apply 0.1E volt to the group 12 of circuits corresponding to the next to least significant digit of the decimal number. I locate tap 98 to provide a voltage 0.01E at tap 98 and connect conductor 76 to this tap. As a result, a voltage of 0.01E volt is applied to the group 14 of circuits corresponding to the least significant digit of the decimal number. In this manner I account for the significance of the respective digits of the decimal number without the necessity of employing a wide dynamic range of resistance values for the resistors.

As will be explained hereinafter, I apply the groups of bits representing the respective digits of the decimal number to the input terminal 78 to render certain of the transistors conductive to connect resistances in the circuits of each group 10, 12 and 14 to produce over-all resistance values to result in respective currents in the groups, which currents have values proportional both to the over-all resistance values and to the significance of the respective digits of the decimal number. In order to sum these currents or voltages, I connect a summing amplifier 104 between conductor 40 and one output terminal 106 of my converter. A conductor 108 connects the other output terminal 110 of my converter to ground. I connect a feedback resistor 112 across amplifier 104.

Figure 3:
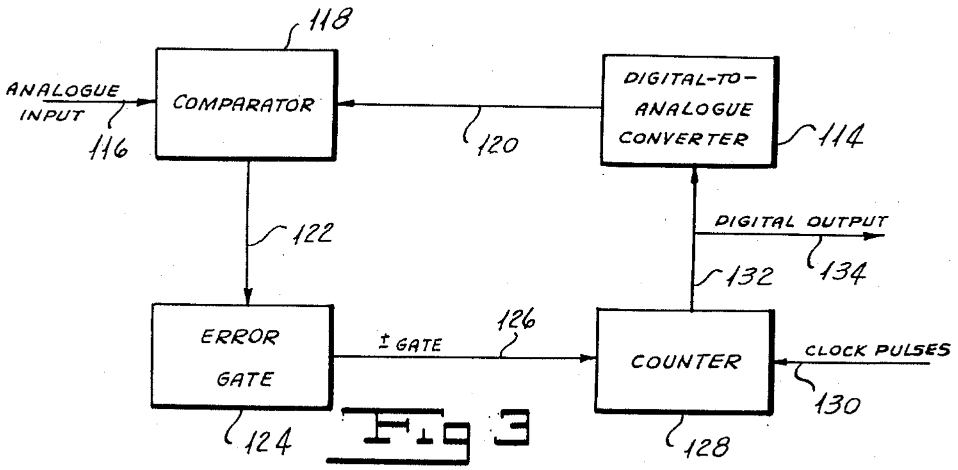
FIGURE 3 is a schematic view of a system, including my digital-to-analogue converter, for producing an analogue-to-digital conversion.

Referring now to FIGURE 3, my converter, indicated by the reference character 114, may be connected in a system to provide an analogue-to-digital conversion. In this system I apply an analogue input signal to one input channel 116 of a comparator 118, which may be, for example, a difference operational amplifier of any type known to the art. A channel 120 connects the output of my converter 114 to the other input channel of comparator 118 to produce an error output signal on the output channel 122 of comparator 118. Channel 122 conducts the error signal from comparator 118 to an error-gating circuit 124, which may, for example, include a phase-sensitive demodulator of a suitable type known to the art, to produce a gating signal, having a polarity representative of the direction of the error, on a channel 126 to activate a counter 128 to which I feed clock pulses through a channel 130. As is well known in the art, counter 128 may be made up of a series of bistable flip-flop circuits triggered by negative pulses. The first counter circuit is triggered by the clock pulses in the presence of an error signal of either polarity and of a sufficient magnitude to represent a difference of "1" for the least significant bit. Each succeeding counter circuit is arranged to be triggered by one or the other of the two complementary output pulses of the preceding counter circuit according as the error signal is positive or negative. In this manner counter 128 counts up and down from a zero count at which the error signal is zero. As a result of the comparison of the output of converter 114 with the analogue input signal on channel 116 the counter output channel 132 continuously carries a digital representation of the analogue input signal on channel 116. A channel 134 connected to channel 132 may be used to carry this digital representation to a remote point at which the representation is to be used.

In operation of my digital-to-analogue converter let us assume that, for example, the decimal number represented is $ABC=728$ in the decimal system. If this is the case, the most significant digit A is represented in the natural binary code as $0111=A_3, A_2, A_1, A_0$. Similarly, the next to least significant digit $B=0010=B_3, B_2, B_1, B_0$ and the least significant digit $C=1000=C_3, C_2, C_1, C_0$. With the bits corresponding to the binary coded representations of the decimal digits applied to terminals 78 through respective circuits of the type shown in FIGURE 2 in the order indicated in FIGURE 1 resistors 30, 28, and 26 having relative values 8R, 4R, and 2R are connected in the circuits of the group 10 of the circuits. Similarly, the resistor 54 having a relative value of 4R is connected in one circuit of the group 12. Only the resistor R is connected in one circuit of the group 14. In one form of operational amplifier 104 having a feedback resistor 112 with a resistance value $R_0$, it can readily be demonstrated that with the resistors of the groups having the values given hereinabove, the output voltage E out has a value:

$$(1)\qquad E\text{ out}=-\left[\frac{R_0}{\frac{8}{7}R}E+\frac{R_0}{4R}0.1E+\frac{R_0}{R}0.01E\right]$$

Providing the terms of the right-hand side of Equation 1 with a common denominator, I obtain:

$$(2)\qquad E\text{ out}=-\left[\frac{7R_0}{8R}E+\frac{2R_0}{8R}0.1E+\frac{8R_0}{8R}0.01E\right]$$

This equation reduces to the form:

$$(3)\qquad E\text{ out}=\frac{-R_0}{8R}7.28E$$

From Equation 3 it will readily be apparent that the current flow in the external circuit or the output voltage has an amplitude which is directly proportional to the decimal number represented, in this case the number 7.28.

When my converter is used in a system such as is shown in FIGURE 3, the continuously generated gating error signal on channel 126 actuates counter 128 to cause it to produce a digital output which is a representation of the analogue input signal on channel 116.

While I have shown and described my system as being used to convert a binary digital representation of a three-digit decimal number, it will readily be appreciated that I may convert representations of numbers having a larger number of digits merely by using additional groups of parallel circuits such as the groups 10, 12, and 14 and by applying voltages to these additional groups in proportion to the significance of the additional digits. It is further to be understood that my system is applicable to a straight binary representation of a number. In this application of my system the respective potentials applied to two groups of parallel circuits, for example, may have a ratio of 1 to 32. In this manner I avoid employing the wide dynamic range of resistance values. It is to be understood also that if a transformer were provided with taps to give respective voltages having magnitudes inversely proportional to the significance of the large number of binary bits a number of circuit resistors all having the same value could be used. I have shown the particular form of my invention described hereinabove as being the most practical form of the invention.

It will be seen that I have accomplished the objects of my invention. I have provided a digital-to-analogue converter for producing an alternating current signal having an amplitude proportional to the magnitude of a binary coded demical number. My converter does not require a wide dynamic range of resistance values. My converter is simpler and less expensive to construct than are converters of the prior art operating with a speed comparable to the speed at which my converter operates. My converter is more compact and is lighter than are converters of the prior art.

For purposes of convenience I have shown an alternator 100 and an autotransformer winding 94 to derive my input voltages. It will be understood by those skilled in the art that a battery may be substituted for the alternator 100 and a voltage dividing resistor for the autotransformer 94.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is therefore to be understood that my invention is not to be limited to the specific details shown and described.

Having thus described my invention, what I claim is:

1. A converter for producing an analogue output representation of a binary coded digital input representation in a given number system including in combination a plurality of sources of a number of voltages having respective magnitudes geometrically related by a factor equal to the system number, a number of groups of circuits, each of said circuits having an impedance and a switching element, the impedance values of the respective impedances of each group being geometrically related by a factor of 2, means for simultaneously applying said voltages respectively to the groups of circuits, a common output conductor and means responsive to said digital input representation for actuating said switching elements to produce said output analogue representation on said output conductor.

2. A converter for producing an analogue output representation proportional to a binary coded digital input representation in a predetermined number system including in combination a plurality of sources of a number of voltages having respective magnitudes geometrically related by a factor equal to the system number, a plurality of groups of circuits, each of said circuits comprising a resistor and a switching element, the resistors of each group having respective impedance values geometrically related by a factor of 2, each of said groups including a number $n$ of circuits such that $2^n$ at least equals the system number, means for simultaneously applying the respective voltages to the groups of circuits, an output conductor, means connecting said circuits to the output conductor and means for actuating said switching elements in response to said digital input representation to produce an analogue output representation of said digital input representation in said output conductor.

3. A digital-to-analogue converter for producing a voltage having a magnitude proportional to a binary coded number represented by binary bit groups corresponding to the respective digits of said number including in combination a plurality of groups of parallel-connected circuits, each of said circuits including a respective normally nonconducting element and an impedance connected in series, said groups corresponding in significance respectively to the digits of said number, the impedances of each particular circuit group having values inversely proportional to the respective significances of the bits of the bit group corresponding to the digit to which the particular circuit group corresponds, means for simultaneously applying respective electrical signals having values proportional to the significances of the respective number digits to said circuit groups and means for applying the bits of said groups of bits to the elements of said groups of circuits with the bits of a group of a given significance being applied to the elements of the group of circuits to which the signal proportional to said given significance is applied to render conducting those elements which correspond to impedances whose parallel-connected value is inversely proportional to the value of a digit of said number.

4. A digital-to-analogue converter as in claim 3 in which said means for applying electrical signals to said groups comprises a transformer winding having a plurality of taps, said taps being located to provide respective voltage values in proportion to each other as the significances of the respective number digits are proportional to each other.

5. A digital-to-analogue converter as in claim 3 in which each of said normally nonconducting elements is a transistor.

6. A digital-to-analogue converter as in claim 3 in which each of said normally nonconducting elements is a transistor having a control terminal, said means for applying said bits to said elements comprising a transformer having a primary winding and a secondary winding having a center tap, a resistance connected between said center tap and the common terminal of one of said transistors and its associated impedance, a shunt transistor having a control terminal, said shunt transistor being connected between said common terminal and ground, the respective terminals of said secondary winding being connected to the respective control terminals of said one transistor and said shunt transistor whereby a bit applied to said primary winding renders said one transistor conducting and maintains said shunt transistor nonconducting.

7. A digital-to-analogue converter as in claim 3 in which said means for applying said electrical signals to said groups of circuits includes a transformer winding having a plurality of taps, said taps being connected to the respective groups of circuits and in which said converter includes a summing amplifier connected in series with said groups of circuits.

References Cited in the file of this patent

UNITED STATES PATENTS

| | | |
|---|---|---|
| 2,685,084 | Lippel et al. | July 27, 1954 |
| 2,738,504 | Gray | Mar. 13, 1956 |
| 2,827,233 | Johnson et al. | Mar. 18, 1958 |
| 2,970,308 | Stringfellow et al. | Jan. 31, 1961 |

FOREIGN PATENTS

| | | |
|---|---|---|
| 1,072,063 | France | Sept. 8, 1954 |